US009722574B2

(12) United States Patent
Ikeuchi

(10) Patent No.: US 9,722,574 B2
(45) Date of Patent: Aug. 1, 2017

(54) ACOUSTIC WAVE DEVICE

(71) Applicant: SKYWORKS FILTER SOLUTIONS JAPAN CO., LTD., Kadoma-Shi (JP)

(72) Inventor: Satoru Ikeuchi, Hyogo-Ken (JP)

(73) Assignee: SKYWORKS FILTER SOLUTIONS JAPAN CO., LTD., Kadoma-Shi (JP)

( * ) Notice: Subject to any disclaimer, the term of this patent is extended or adjusted under 35 U.S.C. 154(b) by 0 days.

(21) Appl. No.: 14/838,543

(22) Filed: Aug. 28, 2015

(65) Prior Publication Data
US 2015/0372661 A1 Dec. 24, 2015

Related U.S. Application Data

(63) Continuation of application No. 13/878,535, filed as application No. PCT/JP2011/006181 on Nov. 7, 2011, now Pat. No. 9,154,114.

(30) Foreign Application Priority Data

Nov. 9, 2010 (JP) .................................. 2010-250444

(51) Int. Cl.
*H03H 9/00* (2006.01)
*H03H 9/70* (2006.01)
H03H 9/64 (2006.01)

(52) U.S. Cl.
CPC ............ *H03H 9/70* (2013.01); *H03H 9/0028* (2013.01); *H03H 9/0057* (2013.01); *H03H 9/64* (2013.01)

(58) Field of Classification Search
CPC ...... H03H 9/70; H03H 9/0057; H03H 9/0028; H03H 9/64; H03H 9/0038

(Continued)

(56) References Cited

U.S. PATENT DOCUMENTS 5,936,483 A 8/1999 Ikada
6,606,016 B2 8/2003 Takamine
(Continued)

FOREIGN PATENT DOCUMENTS

JP 2007-066679 A 3/2007
JP 2009-147740 A 7/2009
(Continued)

OTHER PUBLICATIONS

International Search Report issued on International Patent Application No. PCT/JP2011/006181 mailed on Dec. 6, 2011.

*Primary Examiner* — Dinh T Le
(74) *Attorney, Agent, or Firm* — Lando & Anastasi, LLP

(57) ABSTRACT

An acoustic wave device is provided with a low-frequency side filter having a low-frequency side passband, a high-frequency side filter having a high-frequency side passband, and first and second balanced terminals. The low-frequency side filter is connected to a first unbalanced terminal. The low-frequency side passband is a frequency band from a first minimum frequency to a first maximum frequency. The high-frequency side filter is connected to a second unbalanced terminal. The high-frequency side passband is a frequency band from a second minimum frequency to a second maximum frequency. The low-frequency side filter includes a first longitudinally-coupled acoustic wave resonator and a first one-terminal pair acoustic wave resonator connected in series to the first longitudinally-coupled acoustic wave resonator. An antiresonant frequency of the first one-terminal pair acoustic wave resonator is set to be higher than the first maximum frequency and lower than the second minimum frequency.

19 Claims, 12 Drawing Sheets

(58) Field of Classification Search
USPC .................................. 333/33, 193–196, 133
See application file for complete search history.

(56) References Cited

U.S. PATENT DOCUMENTS

| | | | |
|---|---|---|---|
| 6,771,144 B2 | 8/2004 | Takamine | |
| 6,975,185 B2 | 12/2005 | Tsutsumi et al. | |
| 7,242,268 B2 | 7/2007 | Hagiwara et al. | |
| 7,656,251 B1 * | 2/2010 | Bauder | H04B 1/52 333/101 |
| 7,868,716 B2 * | 1/2011 | Okuda | H03H 9/0085 333/133 |
| 7,986,200 B2 | 7/2011 | Ono et al. | |
| 2003/0155993 A1 * | 8/2003 | Takamine | H03H 9/0038 333/133 |
| 2009/0153269 A1 | 6/2009 | Ono et al. | |
| 2009/0273409 A1 | 11/2009 | Okuda | |
| 2010/0074240 A1 * | 3/2010 | Jian | H04B 1/0057 370/339 |

FOREIGN PATENT DOCUMENTS

| | | |
|---|---|---|
| WO | 2008/096514 A1 | 8/2008 |
| WO | 2010/038381 A1 | 4/2010 |

\* cited by examiner

FIG. 2B

|  | Example | | Comparative example | |
|---|---|---|---|---|
|  | Resonant frequency [GHz] | Antiresonant frequency [GHz] | Resonant frequency [GHz] | Antiresonant frequency [GHz] |
| One-terminal pair resonator 19, 119 | 1.84999 | 1.91589 | 1.86747 | 1.93420 |
| One-terminal pair resonator 20, 120 | 1.85378 | 1.92011 | 1.87132 | 1.93842 |
| One-terminal pair resonator 21, 121 | 1.84999 | 1.91589 | 1.86747 | 1.93420 |
| One-terminal pair resonator 22, 122 | 1.85378 | 1.92011 | 1.87132 | 1.93842 |
| One-terminal pair resonator 24, 124 | 1.93686 | 2.00663 | 1.93686 | 2.00663 |
| One-terminal pair resonator 25, 125 | 1.95385 | 2.02185 | 1.95385 | 2.02185 |
| One-terminal pair resonator 26, 126 | 1.93686 | 2.00663 | 1.93686 | 2.00663 |
| One-terminal pair resonator 27, 127 | 1.95385 | 2.02185 | 1.95385 | 2.02185 |

ACOUSTIC WAVE DEVICE

RELATED APPLICATIONS

This application is a continuation of and claims priority under 34 U.S.C. §120 to co-pending U.S. application Ser. No. 13/878,535 titled "ACOUSTIC WAVE DEVICE" and filed on Apr. 9, 2013, which is a National Stage application of PCT international application PCT/JP2011/006181 filed on Nov. 7, 2011, which claims priority to Japanese Patent Application No. 2010-250444 filed on Nov. 9, 2010. The disclosures of these applications including the specifications, the drawings, and the claims are hereby incorporated by reference in their entireties for all purposes.

BACKGROUND

1. Technical Field

The present invention relates to an acoustic wave device mainly used for mobile communication devices and the like.

2. Background Art

In recent years, acoustic wave devices provided with a plurality of high-frequency filters of different passbands have become more widely used in mobile telephones and the like.

FIG. 10 is a circuit diagram of conventional acoustic wave device 100.

Referring to FIG. 10, acoustic wave device 100 is provided with unbalance-balance conversion type low-frequency side filter 2 and unbalance-balance conversion type high-frequency side filter 3 that are disposed on piezoelectric substrate 1 made of piezoelectric single crystals. Low-frequency side filter 2 has a passband whose center frequency is relatively low. High-frequency side filter 3 has a passband whose center frequency is relatively high. Low-frequency side filter 2 and high-frequency side filter 3 are each configured such that longitudinally-coupled acoustic wave resonator 6 and one-terminal pair acoustic wave resonator 7 are connected in series between unbalanced terminal 4 and balanced terminal 5. Different electronic circuits are connected to balanced terminal 5 connected to low-frequency side filter 2 and balanced terminal 5 connected to high-frequency side filter 3, respectively, of acoustic wave device 100. Acoustic wave device 100 performs filtering of a plurality of electrical signals of different frequency bands.

Here, as the information on prior art document relating to conventional acoustic wave device 100, International Application Publication No. WO2008/096514 is known, for example.

With communication devices using conventional acoustic wave device 100 as described above, there is a tendency to downsize and reduce costs by sharing the electronic circuits connected to balanced terminals 5. For example, sharing balanced terminal 5 connected to low-frequency side filter 2 and balanced terminal 5 connected to high-frequency side filter 3 has been requested.

If balanced terminals 5 are shared in conventional acoustic wave device 100, low-frequency side filter 2 and high-frequency side filter 3 are connected via balanced terminal 5. Accordingly, low-frequency side filter 2 and high-frequency side filter 3 on a side of balanced terminal 5 are affected by impedance from each other, and isolation between the filters deteriorates. In addition, an insertion loss increases due to impedance mismatching between low-frequency side filter 2 and high-frequency side filter 3, and thus a magnitude of balance decreases. As a result, electrical characteristics of acoustic wave device 100 deteriorate.

SUMMARY

An acoustic wave device according to the present invention is provided with a low-frequency side filter having a low-frequency side passband, a high-frequency side filter having a high-frequency side passband, and first and second balanced terminals. The low-frequency side filter is connected to a first unbalanced terminal. The low-frequency side passband is a frequency band from a first minimum frequency to a first maximum frequency. The high-frequency side filter is connected to a second unbalanced terminal. The high-frequency side passband is a frequency band from a second minimum frequency to a second maximum frequency. The first and second balanced terminals are connected to the low-frequency side and high-frequency side filters in common. The low-frequency side filter includes a first longitudinally-coupled acoustic wave resonator, and a first one-terminal pair acoustic wave resonator connected in series to the first longitudinally-coupled acoustic wave resonator. An antiresonant frequency of the first one-terminal pair acoustic wave resonator is set to be higher than the first maximum frequency and lower than the second minimum frequency.

The acoustic wave device is capable of suppressing mixing of a signal to the other filter, and improving impedance matching in the passband.

BRIEF DESCRIPTION OF DRAWINGS

FIG. 2B is a table comparing values of resonant frequencies and antiresonant frequencies of the one-terminal pair acoustic wave resonators of the acoustic wave device according to Embodiment 1 and the acoustic wave device of the comparative example, respectively.

DESCRIPTION OF EMBODIMENTS

First Exemplary Embodiment

Acoustic wave device 101 according to Embodiment 1 will be described with reference to the drawings.

Figure 1A:
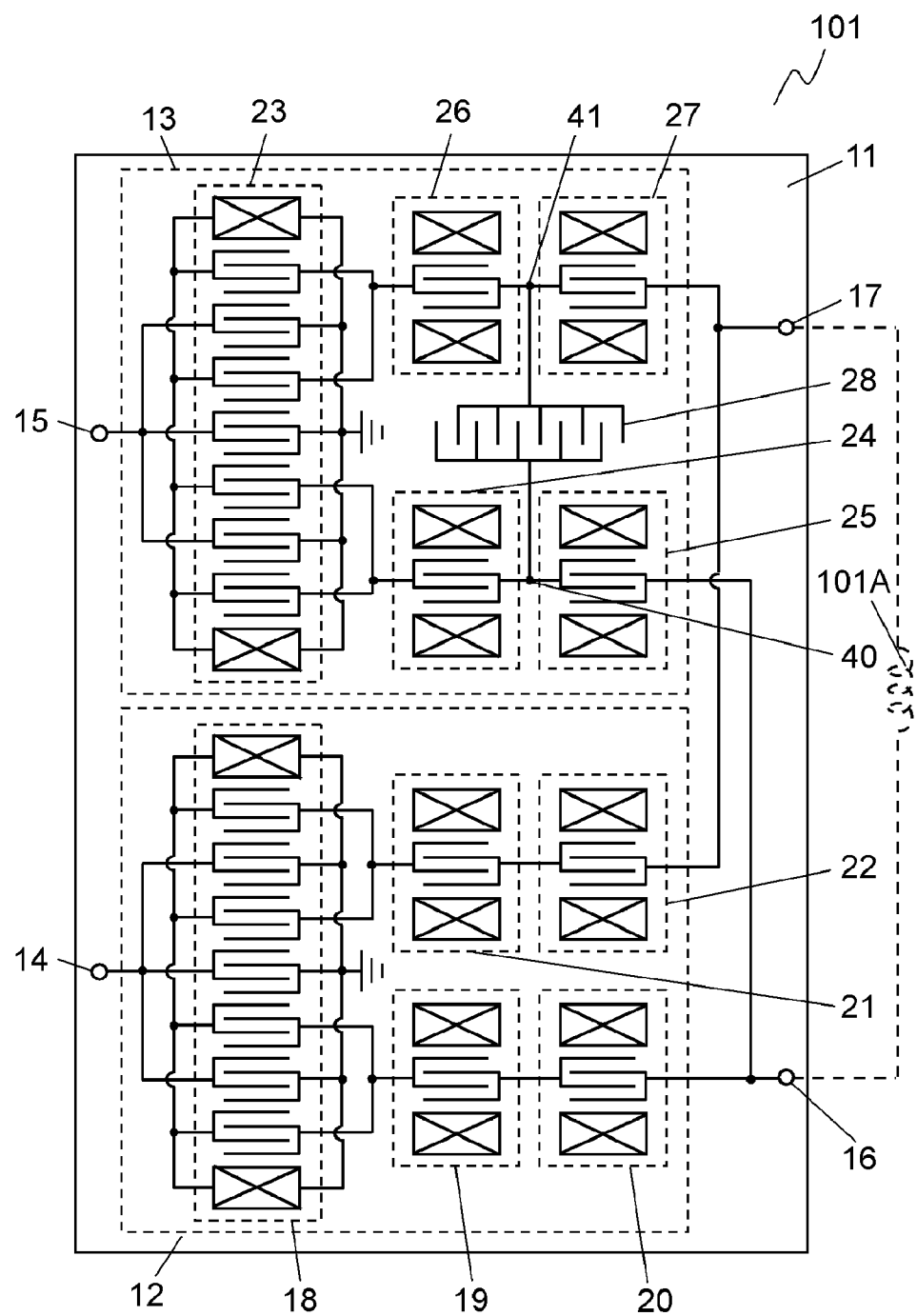
FIG. 1A is a circuit diagram of an acoustic wave device according to Embodiment 1.

FIG. 1A is a circuit diagram of acoustic wave device 101 according to Embodiment 1. Referring to FIG. 1A, acoustic wave device 101 is provided with low-frequency side filter 12 having low-frequency side passband PB1 whose center frequency is relatively low and high-frequency side filter 13 having high-frequency side passband PB2 whose center frequency is relatively high that are disposed on piezoelectric substrate 11. Acoustic wave device 101 includes first unbalanced terminal 14, second unbalanced terminal 15, first balanced terminal 16, and second balanced terminal 17. Unbalanced terminal 14 is connected to low-frequency side filter 12. Unbalanced terminal 15 is connected to high-frequency side filter 13. Balanced terminals 16 and 17 are connected to both of low-frequency side filter 12 and high-frequency side filter 13.

Low-frequency side filter 12 includes first longitudinally-coupled acoustic wave resonator 18, first first-stage one-terminal pair acoustic wave resonator 19, and first second-stage one-terminal pair acoustic wave resonator 20. Longitudinally-coupled acoustic wave resonator 18 is connected to unbalanced terminal 14. One-terminal pair acoustic wave resonator 19 and one-terminal pair acoustic wave resonator 20 are connected between longitudinally-coupled acoustic wave resonator 18 and balanced terminal 16 in series with each other. Low-frequency side filter 12 further includes second first-stage one-terminal pair acoustic wave resonator 21 and second second-stage one-terminal pair acoustic wave resonator 22. One-terminal pair acoustic wave resonator 21 and one-terminal pair acoustic wave resonator 22 are connected between longitudinally-coupled acoustic wave resonator 18 and balanced terminal 17 in series with each other.

High-frequency side filter 13 includes second longitudinally-coupled acoustic wave resonator 23, third first-stage one-terminal pair acoustic wave resonator 24, and third second-stage one-terminal pair acoustic wave resonator 25. Second longitudinally-coupled acoustic wave resonator 23 is connected to second unbalanced terminal 15. First-stage one-terminal pair acoustic wave resonator 24 and second-stage one-terminal pair acoustic wave resonator 25 are connected between longitudinally-coupled acoustic wave resonator 23 and balanced terminal 16 in series with each other at connection point 40. High-frequency side filter 13 further includes fourth first-stage one-terminal pair acoustic wave resonator 26 and fourth second-stage one-terminal pair acoustic wave resonator 27. One-terminal pair acoustic wave resonator 26 and one-terminal pair acoustic wave resonator 27 are connected between longitudinally-coupled acoustic wave resonator 23 and balanced terminal 17 in series with each other at connection point 41. Capacitive element 28 is connected in series between connection point 40 and connection point 41. Capacitive element 28 is formed by a conductive pattern provided on piezoelectric substrate 11. When acoustic wave device 101 is used by being connected within an electronic device, it is configured such that inductor 101A is connected as an external circuit between first balanced terminal 16 and second balanced terminal 17.

In Embodiment 1, low-frequency side passband PB1 that is a passband of low-frequency side filter 12 is from 1.805 GHz to 1.880 GHz. The center frequency of low-frequency side passband PB1 is 1.8425 GHz, which is a middle point of the passband, a bandwidth of the same is 0.075 GHz, and a fractional bandwidth of the same obtained by dividing the bandwidth by the center frequency is 4.07%. High-frequency side passband PB2 that is a passband of high-frequency side filter 13 is from 1.930 GHz to 1.990 GHz. The center frequency of high-frequency side passband PB2 is 1.960 GHz, which is a middle point of the passband, a bandwidth of the same is 0.060 GHz, and a fractional bandwidth of the same obtained by dividing the bandwidth by the center frequency is 3.06%.

Antiresonant frequencies fAR19, fAR20, fAR21, and fAR22 of one-terminal pair acoustic wave resonators 19, 20, 21, and 22 are set to be out of low-frequency side passband PB1 on the high-frequency side, and out of high-frequency side passband PB2 on the low-frequency side. Specifically, antiresonant frequencies fAR19, fAR20, fAR21, and fAR22 of one-terminal pair acoustic wave resonators 19, 20, 21, and 22 are higher than 1.880 GHz, which is a maximum frequency of low-frequency side passband PB1, and lower than 1.930 GHz, which is a minimum frequency of high-frequency side passband PB2.

Figure 10:
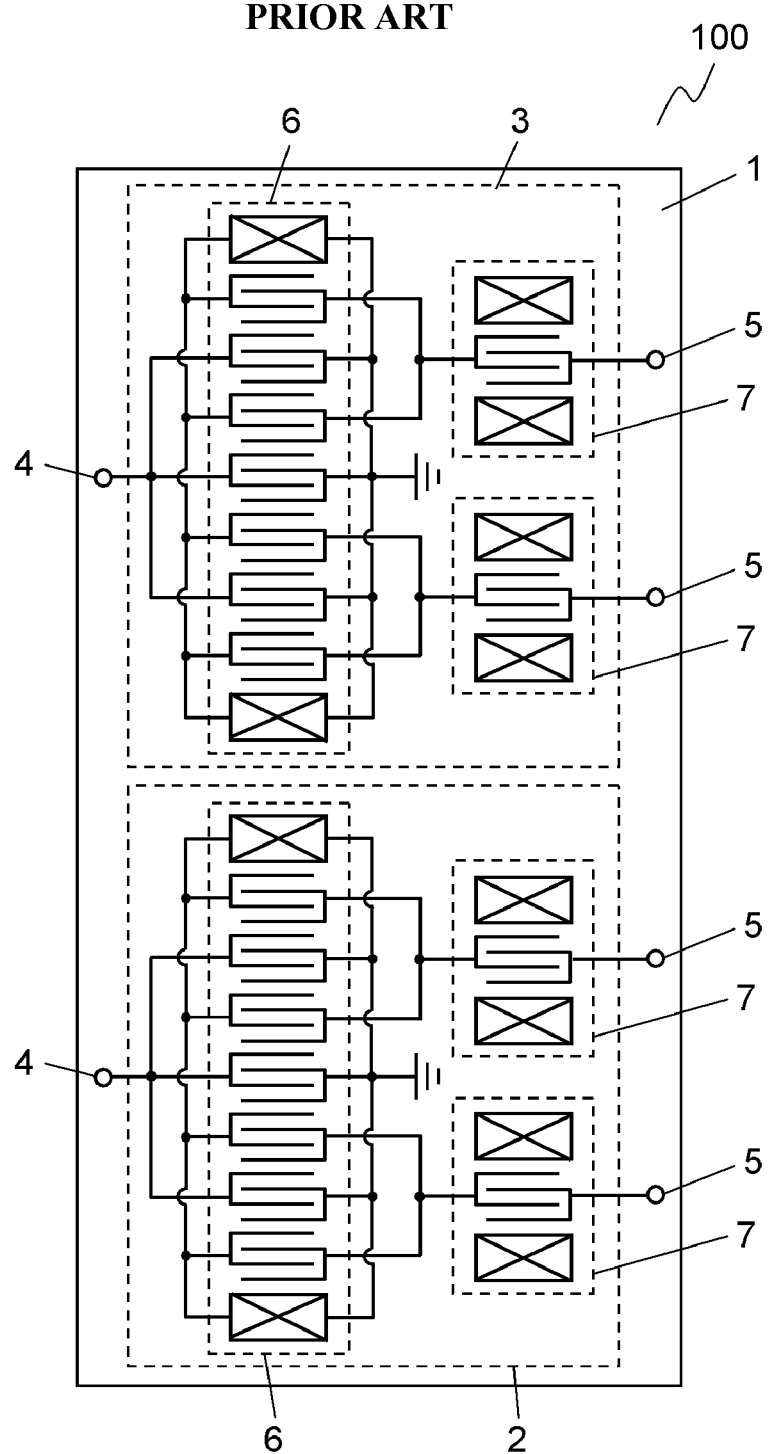
FIG. 10 is a circuit diagram of a conventional acoustic wave device.

If balanced terminals 5 are shared in conventional acoustic wave device 100 illustrated in FIG. 10, low-frequency side filter 2 and high-frequency side filter 3 are connected via balanced terminal 5. Accordingly, low-frequency side filter 2 and high-frequency side filter 3 on the side of balanced terminal 5 are affected by impedance from each other. With this, a signal of the other filter is mixed in, and isolation between the filters deteriorates. In addition, an insertion loss increases due to impedance mismatching between low-frequency side filter 2 and high-frequency side filter 3, and thus a magnitude of balance decreases. As a result, electrical characteristics of acoustic wave device 100 deteriorate.

Bandpass characteristics of acoustic wave device 101 as an example according to Embodiment 1 and acoustic wave device 111 as a comparative example will be described.

Figure 1B:
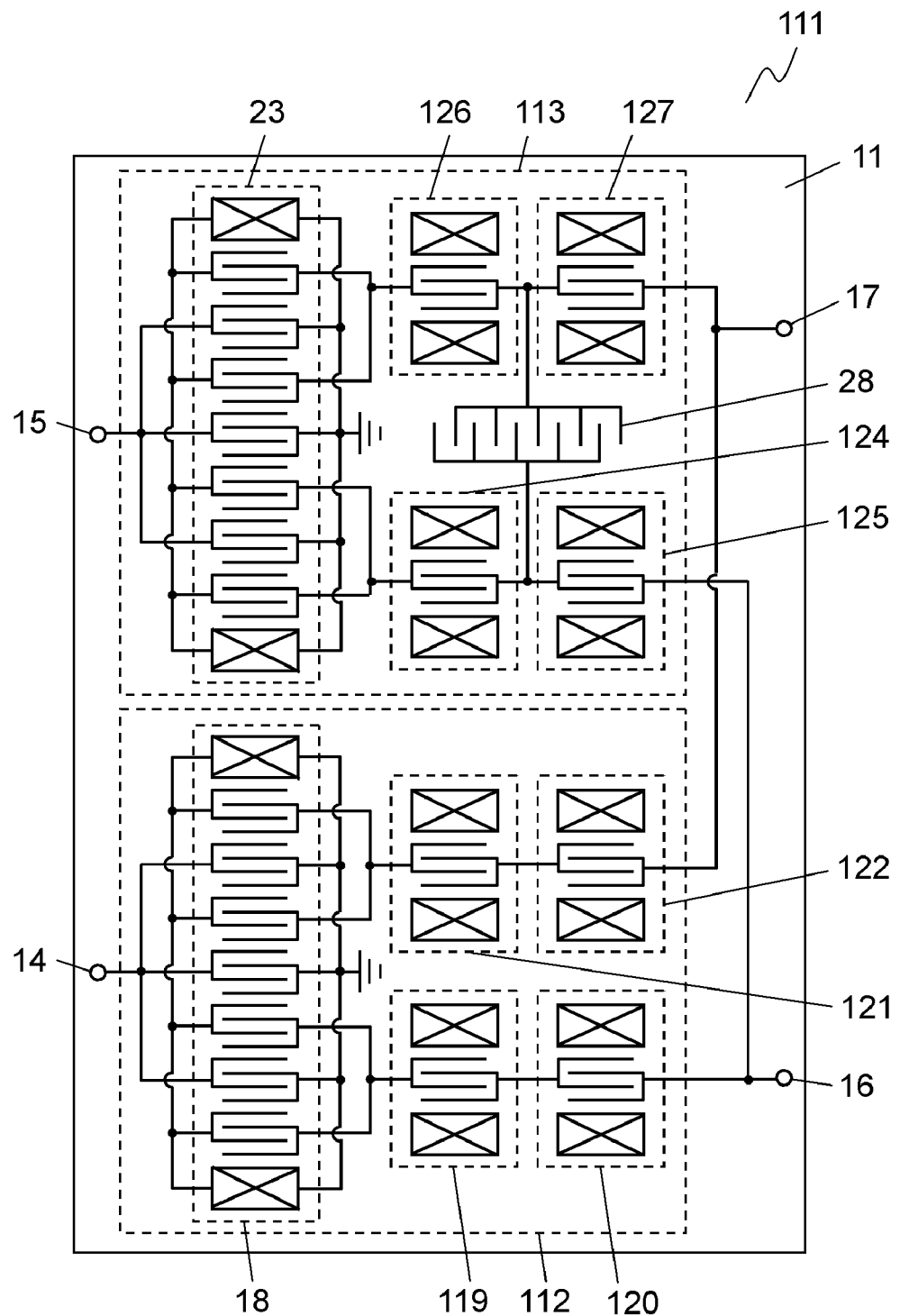
FIG. 1B is a circuit diagram of an acoustic wave device of a comparative example.

FIG. 1B is a circuit diagram of acoustic wave device 111 as the comparative example. Components of acoustic wave device 111 illustrated in FIG. 1B that are the same as the components of acoustic wave device 101 according to Embodiment 1 illustrated in FIG. 1A are denoted by the same reference numerals.

Acoustic wave device 111 is provided with low-frequency side filter 112 and high-frequency side filter 113, in place of low-frequency side filter 12 and high-frequency side filter 13 of acoustic wave device 101. Low-frequency side filter 112 includes first first-stage one-terminal pair acoustic wave resonator 119, first second-stage one-terminal pair acoustic wave resonator 120, second first-stage one-terminal pair acoustic wave resonator 121, and second second-stage one-terminal pair acoustic wave resonator 122, in place of first first-stage one-terminal pair acoustic wave resonator 19, first second-stage one-terminal pair acoustic wave resonator 20, second first-stage one-terminal pair acoustic wave resonator 21, and second second-stage one-terminal pair acoustic wave resonator 22 in acoustic wave device 101. High-frequency side filter 113 includes third first-stage one-terminal pair acoustic wave resonator 124, third second-stage one-terminal pair acoustic wave resonator 125, fourth first-stage one-terminal pair acoustic wave resonator 126, and fourth second-stage one-terminal pair acoustic wave resonator 127, in place of third first-stage one-terminal pair acoustic wave resonator 24, third second-stage one-terminal pair acoustic wave resonator 25, fourth first-stage one-terminal pair acoustic wave resonator 26, and fourth second-stage one-terminal pair acoustic wave resonator 27 in acoustic wave device 101.

In acoustic wave device 111 as the comparative example, low-frequency side filter 112 and high-frequency side filter 113 are connected to common balanced terminals 16 and 17. Antiresonant frequencies fAR119, fAR120, fAR121, and fAR122 of one-terminal pair acoustic wave resonators 119, 120, 121, and 122 that are connected in series in low-frequency side filter 112 are set to be within high-frequency side passband PB2. With this, in high-frequency side passband PB2, impedance of low-frequency side filter 112 viewed from common balanced terminals 16 and 17 increases. As a result, it is possible to minimize an energy loss from high-frequency side filter 113 to low-frequency side filter 112.

Figure 2A:
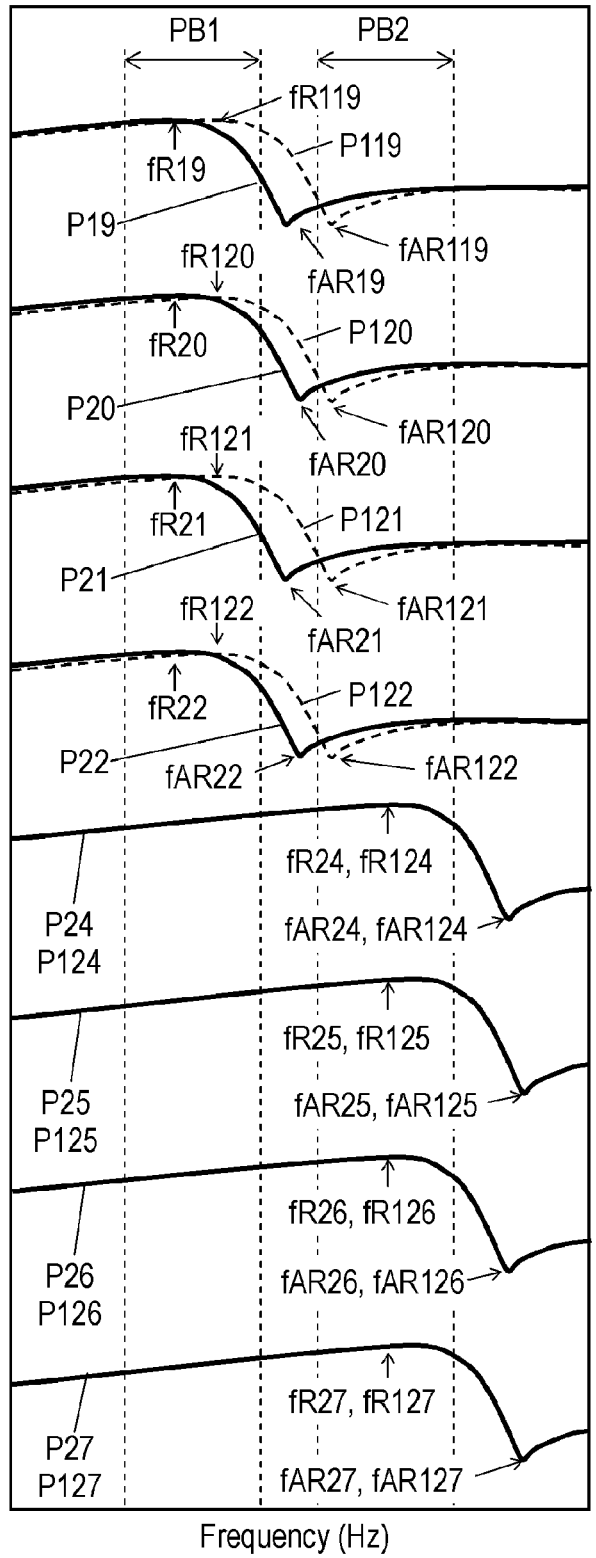
FIG. 2A is a conceptual diagram of bandpass characteristics of one-terminal pair acoustic wave resonators of the acoustic wave devices in an example according to Embodiment 1 and in the comparative example, respectively.

FIG. 2A is a conceptual diagram of bandpass characteristics of the one-terminal pair acoustic wave resonators of acoustic wave device 101 as the example and acoustic wave device 111 as the comparative example, respectively. Referring to FIG. 2A, solid lines represent bandpass characteristic P19 of one-terminal pair acoustic wave resonator 19, bandpass characteristic P20 of one-terminal pair acoustic wave resonator 20, bandpass characteristic P21 of one-terminal pair acoustic wave resonator 21, bandpass characteristic P22 of one-terminal pair acoustic wave resonator 22, bandpass characteristic P24 of one-terminal pair acoustic wave resonator 24, bandpass characteristic P25 of one-terminal pair acoustic wave resonator 25, bandpass characteristic P26 of one-terminal pair acoustic wave resonator 26, and bandpass characteristic P27 of one-terminal pair acoustic wave resonator 27. Resonant frequencies fR19-fR22 of one-terminal pair acoustic wave resonators 19-22 are provided within low-frequency side passband PB1. Antiresonant frequencies fAR19-fAR22 of one-terminal pair acoustic wave resonators 19-22 are provided between the maximum frequency of low-frequency side passband PB1 and the minimum frequency of high-frequency side passband PB2. Referring to FIG. 2A, dashed lines represent bandpass characteristic P119 of one-terminal pair acoustic wave resonator 119, bandpass characteristic P120 of one-terminal pair acoustic wave resonator 120, bandpass characteristic P121 of one-terminal pair acoustic wave resonator 121, and bandpass characteristic P122 of one-terminal pair acoustic wave resonator 122, of acoustic wave device 111 as the comparative example illustrated in FIG. 1B. Resonant frequencies fR119-fR122 of one-terminal pair acoustic wave resonators 119-122 are set to be within low-frequency side passband PB1. Antiresonant frequencies fAR119-fAR122 of one-terminal pair acoustic wave resonators 119-122 are set to be within high-frequency side passband PB2.

In acoustic wave device 111 of the comparative example, high-frequency side filter 113 operates in a capacitive mode in low-frequency side passband PB1. However, as antiresonant frequencies fAR119-fAR122 are within high-frequency side passband PB2, in high-frequency side passband PB2, impedance of one-terminal pair acoustic wave resonators 119-122 connected in series within filter 112 increases. Therefore, low-frequency side filter 112 does not operate in the capacitive mode in entire band frequencies of high-frequency side passband PB2. Accordingly, when viewing composite impedance of low-frequency side filter 112 and high-frequency side filter 113 from a side of common connection terminals 16 and 17, a difference between the impedance in low-frequency side passband PB1 and the impedance in high-frequency side passband PB2 becomes large, and it is difficult to match the impedance between the passbands on the low-frequency side and the high-frequency side.

On the other hand, in acoustic wave device 101 as the example, antiresonant frequencies fAR19-fAR22 of one-terminal pair acoustic wave resonators 19-22 of low-frequency side filter 12 are set to be between the maximum frequency of low-frequency side passband PB1 and the minimum frequency of high-frequency side passband PB2. Accordingly, impedance of high-frequency side passband PB2 of low-frequency side filter 12 is a capacitive impedance. Impedance of low-frequency side passband PB1 of high-frequency side filter 13 is also a capacitive impedance. In this manner, by setting antiresonant frequencies fAR19-fAR22 in which the impedance of low-frequency side filter 12 has an open characteristic between low-frequency side passband PB1 and high-frequency side passband PB2, low-frequency side filter 12 operates in the capacitive mode in high-frequency side passband PB2. With this, it is possible to make the difference between the impedance in low-frequency side passband PB1 and the impedance in high-frequency side passband PB2 on a side of common connection terminals 16 and 17 small. Accordingly, it is possible to suppress an energy loss from high-frequency side filter 13 to low-frequency side filter 12 and to improve impedance matching. In addition, as antiresonant frequencies fAR19-fAR22 of one-terminal pair acoustic wave resonators 19-22 are set near the high-frequency side of low-frequency side passband PB1, it is possible to improve steepness of low-frequency side filter 12. By inductor 101A provided as an external circuit between balanced terminal 16 and balanced terminal 17, it is possible to cancel the capacitive mode of low-frequency side filter 12 and high-frequency side filter 13.

Referring to FIG. 2A, resonant frequencies fR24-fR27 of one-terminal pair acoustic wave resonators 24-27 of acoustic wave device 101 are provided within high-frequency side passband PB2. Antiresonant frequencies fAR24-fAR27 of one-terminal pair acoustic wave resonators 24-27 are set to be out of high-frequency side passband PB2 on the high-frequency side, that is, set to be a value higher than a maximum frequency of high-frequency side passband PB2. Similarly, in acoustic wave device 111 as the comparative example, resonant frequencies fR124-fR127 of one-terminal pair acoustic wave resonators 124-127 are also provided within high-frequency side passband PB2, and antiresonant frequencies fAR124-fAR127 are set to be out of high-frequency side passband PB2 on the high-frequency side, that is, set to be a value higher than the maximum frequency of high-frequency side passband PB2.

FIG. 2B shows values of resonant frequencies fR19-fR22, fR24-fR27, fR119-fR122, and fR124-fR127 and antiresonant frequencies fAR19-fAR22, fAR24-fAR27, fAR119-fAR122, and fAR124-fAR127 in Embodiment 1.

Next, characteristics of acoustic wave device 101 as the example and acoustic wave device 111 as the comparative example will be described.

FIG. 3A through FIG. 7 are characteristic diagrams, obtained by simulations, of various characteristics of acoustic wave device 101 as the example and acoustic wave device 111 in the comparative example. Referring to FIG. 3A through FIG. 7, solid lines represent characteristics obtained as a result of a simulation regarding acoustic wave device 101 using one-terminal pair acoustic wave resonators 19-22 and 24-27 illustrated in FIG. 2B. Dashed lines represent characteristics obtained as a result of a simulation regarding acoustic wave device 111 using one-terminal pair acoustic wave resonators 119-122 and 124-127 of the comparative example illustrated in FIG. 2B. Referring to FIG. 3A through FIG. 7, a frequency range from marker A to marker B corresponds to low-frequency side passband PB1. Specifically, marker A represents a minimum frequency of low-frequency side passband PB1, and marker B represents the maximum frequency of low-frequency side passband PB1. A frequency range from marker C to marker D corresponds to high-frequency side passband PB2. Specifically, marker C represents the minimum frequency of high-frequency side passband PB2, and marker D represents the maximum frequency of high-frequency side passband PB2.

Figure 3A:
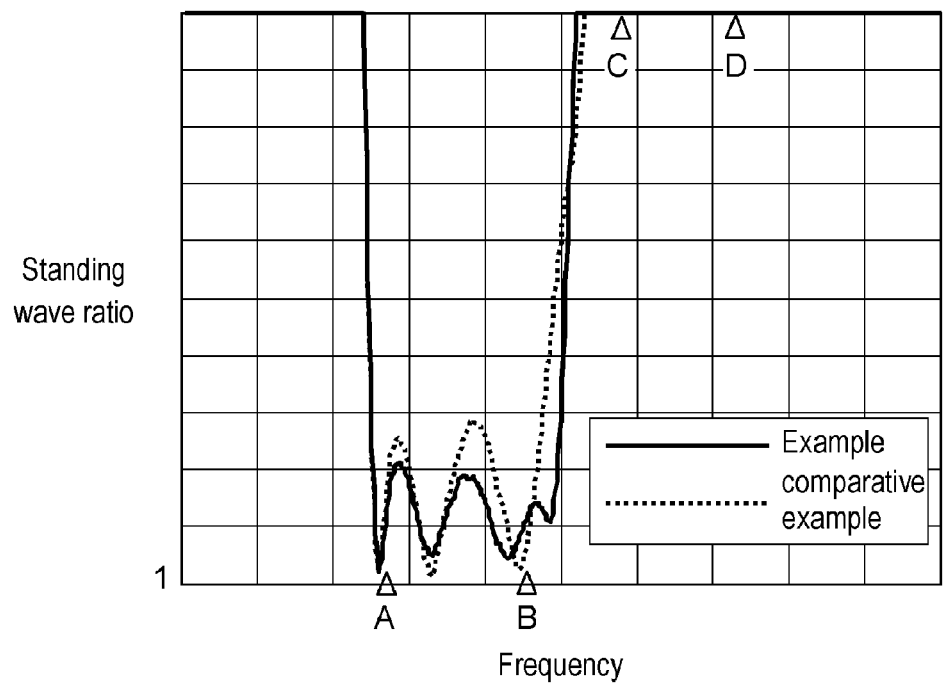
FIG. 3A is a characteristic diagram of standing wave ratios of the acoustic wave devices according to Embodiment 1 and the comparative example.

FIG. 3A is a characteristic diagram of a standing wave ratio of acoustic wave device 101 and a standing wave ratio of acoustic wave device 111 viewed from unbalanced terminal 14 (low-frequency side unbalanced terminal). In the example of FIG. 3A, the standing wave ratio of acoustic wave device 101 viewed from unbalanced terminal 14 is closer to 1 than the standing wave ratio of acoustic wave device 111 is. From this, it can be seen that impedance matching of low-frequency side filter 12 of acoustic wave device 101 in low-frequency side passband PB1 is improved to a large extent.

Figure 3B:
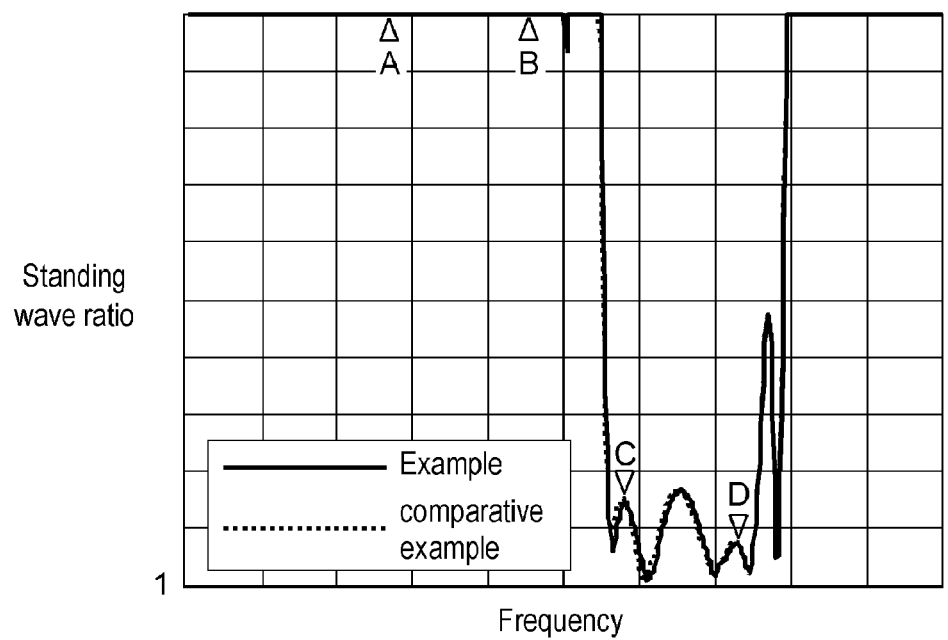
FIG. 3B is a characteristic diagram of standing wave ratios of the acoustic wave devices according to Embodiment 1 and the comparative example.

FIG. 3B is a characteristic diagram of the standing wave ratio of acoustic wave device 101 and the standing wave ratio of acoustic wave device 111 viewed from unbalanced terminal 15 (high-frequency side unbalanced terminal). In FIG. 3B, the standing wave ratio of acoustic wave device 101 viewed from unbalanced terminal 15 is hardly different from the standing wave ratio of acoustic wave device 111. From this, it can be seen that impedance matching of acoustic wave device 101 in high-frequency side passband PB2 is not deteriorated.

Figure 4:
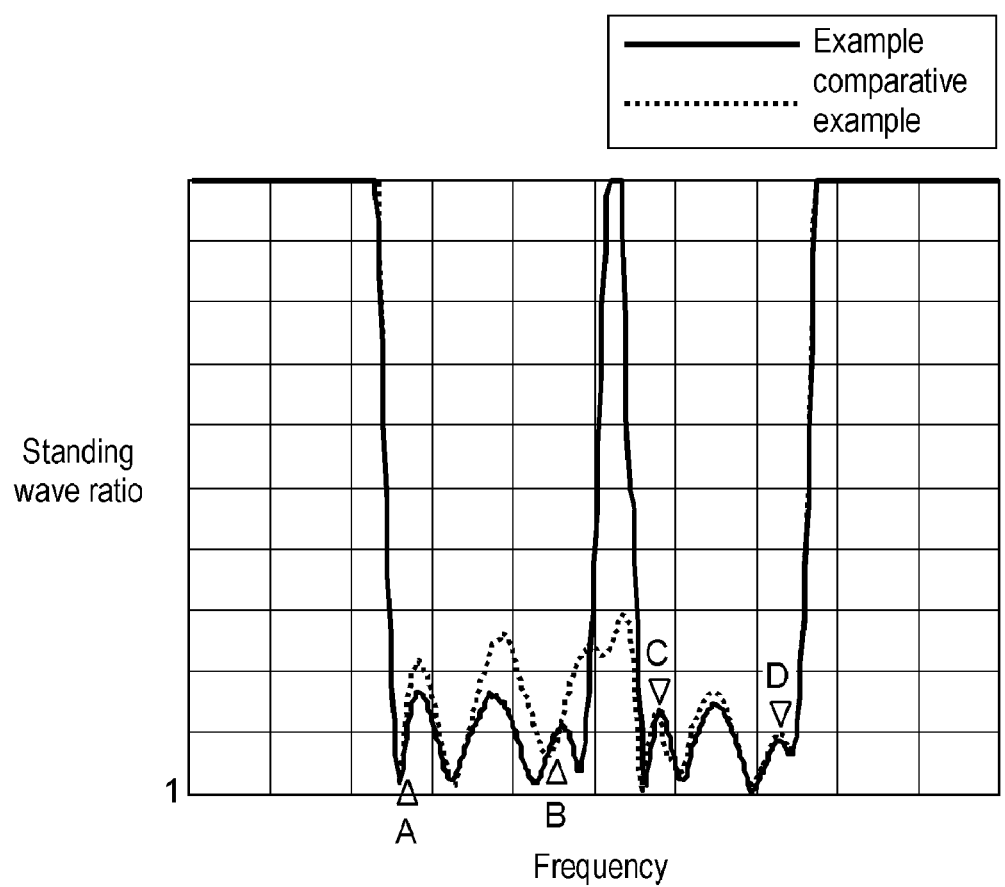
FIG. 4 is a characteristic diagram of standing wave ratios of the acoustic wave devices according to Embodiment 1 and the comparative example.

FIG. 4 is a characteristic diagram of the standing wave ratio of acoustic wave device 101 and the standing wave ratio of acoustic wave device 111 viewed from balanced terminal 16 and balanced terminal 17. In low-frequency side passband PB1 of FIG. 4, the standing wave ratio of acoustic wave device 101 viewed from balanced terminal 16 and balanced terminal 17 is closer to 1 than the standing wave ratio of acoustic wave device 111 is, and is improved to a large extent. From this, it can be seen that impedance matching of acoustic wave device 101 is improved to a large extent.

Figure 5A:
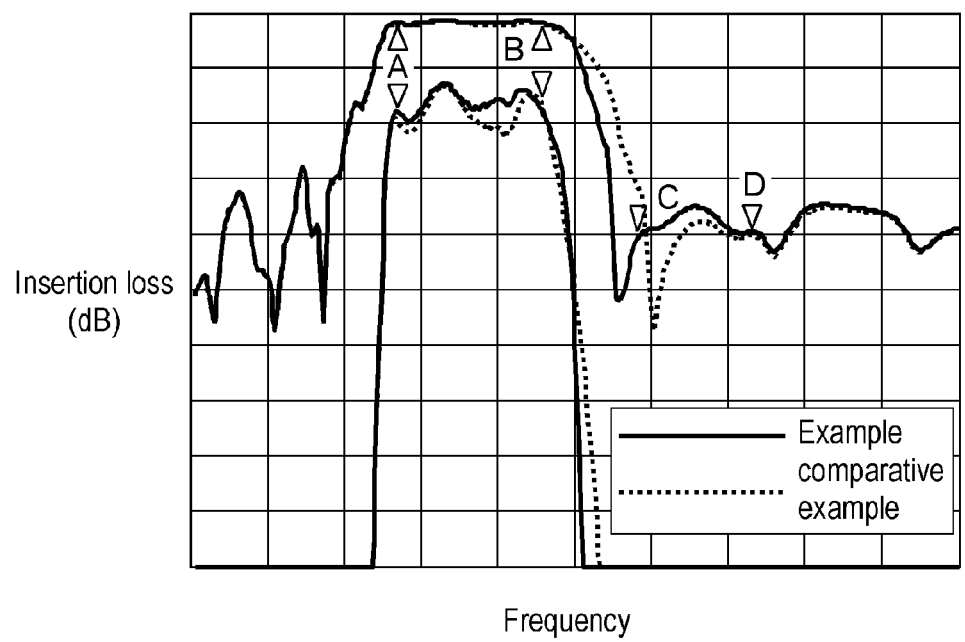
FIG. 5A is a diagram of bandpass characteristics of the acoustic wave devices according to Embodiment 1 and the comparative example.

FIG. 5A is the diagram of bandpass characteristics of low-frequency side filter 12 and low-frequency side filter 112 including low-frequency side passband PB1 and high-frequency side passband PB2. Referring to FIG. 5A, an insertion loss of the comparative example is large in low-frequency side passband PB1 as compared to the example. By contrast, the example can decrease an insertion loss in particular in a half of a high-frequency side in low-frequency side passband PB1 and the electrical characteristic of the acoustic wave device is improved to a large extent. This is because it is possible to reduce a reflection loss of electrical signal energy by improving impedance matching in this region of acoustic wave device 101. Further, the example shows steep attenuation between low-frequency side passband PB1 and high-frequency side passband PB2 as compared to the comparative example, its insertion loss steeply increases. This is because antiresonant frequencies fAR19-fAR22 are made closer to low-frequency side passband PB1 than antiresonant frequencies fAR119-fAR122 of the comparative example are.

Figure 5B:
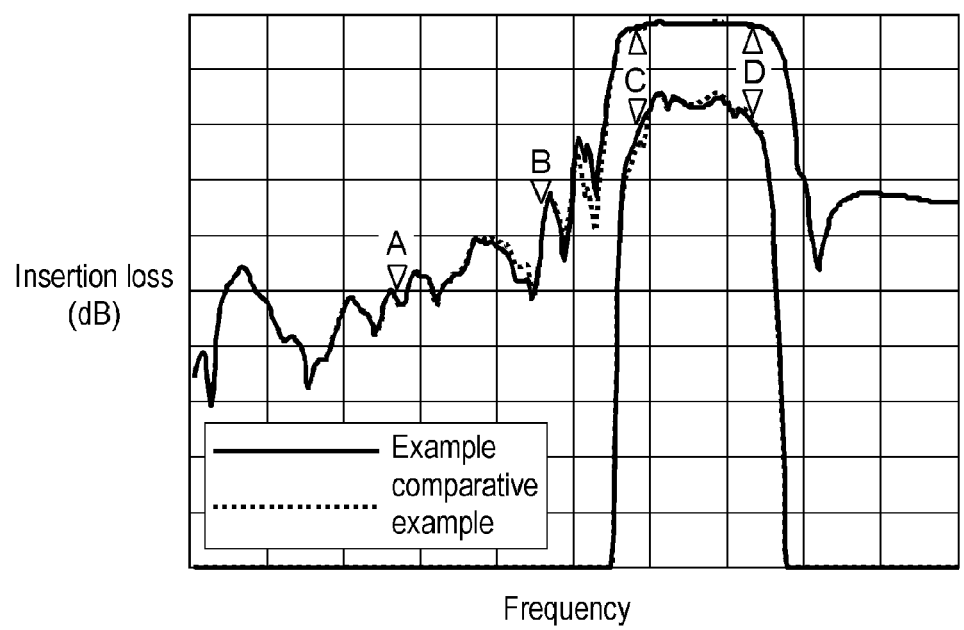
FIG. 5B is a diagram of bandpass characteristics of the acoustic wave devices according to Embodiment 1 and the comparative example.

FIG. 5B is a diagram of bandpass characteristics of high-frequency side filter 13 of the example and high-frequency side filter 113 of the comparative example including low-frequency side passband PB1 and high-frequency side passband PB2. Referring to FIG. 5B, there is no large difference between an insertion loss of high-frequency side filter 13 and an insertion loss of high-frequency side filter 113. However, the insertion loss of acoustic wave device 101 is further reduced near the minimum frequency of high-frequency side passband PB2.

Figure 6A:
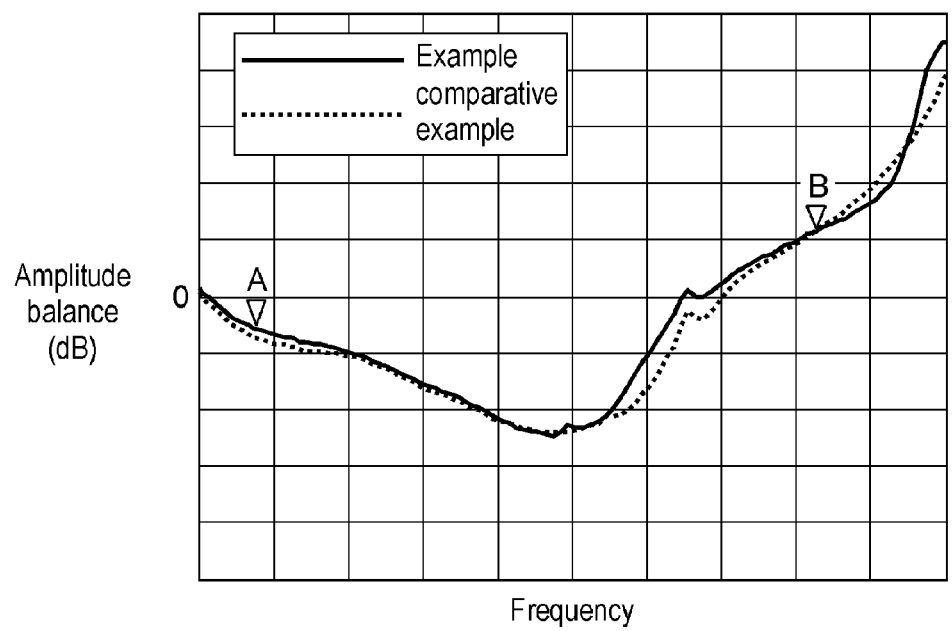
FIG. 6A is a characteristic diagram of amplitude balances of the acoustic wave devices according to Embodiment 1 and the comparative example.

FIG. 6A is a characteristic diagram of amplitude balances of low-frequency side filter 12 of the example and low-frequency side filter 112 of the comparative example in low-frequency side passband PB1, respectively. As shown in FIG. 6A, in the example, as compared to the comparative example, the amplitude balance between balanced terminals 16 and 17 of low-frequency side filter 12 is improved to a large extent in the half of the high-frequency side in low-frequency side passband PB1. This is because impedance matching in this region is improved.

Figure 6B:
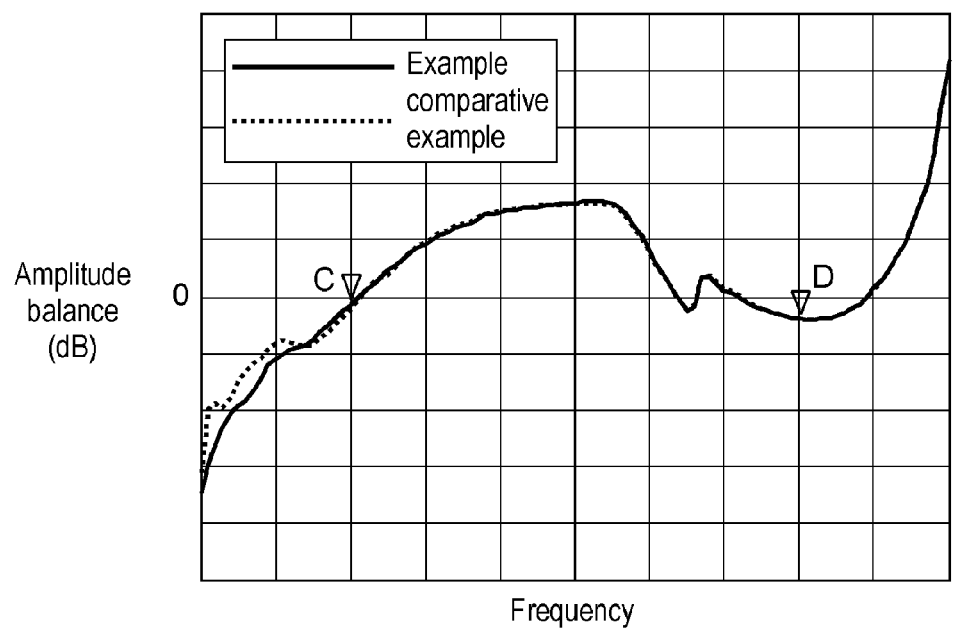
FIG. 6B is a characteristic diagram of amplitude balances of the acoustic wave devices according to Embodiment 1 and the comparative example.

FIG. 6B is the characteristic diagram of amplitude balances of high-frequency side filter 13 of the example and high-frequency side filter 113 of the comparative example in high-frequency side passband PB2. In FIG. 6B, in high-frequency side passband PB2, the amplitude balance between balanced terminals 16 and 17 of high-frequency side filter 13 is hardly different from that of high-frequency side filter 113.

Figure 7A:
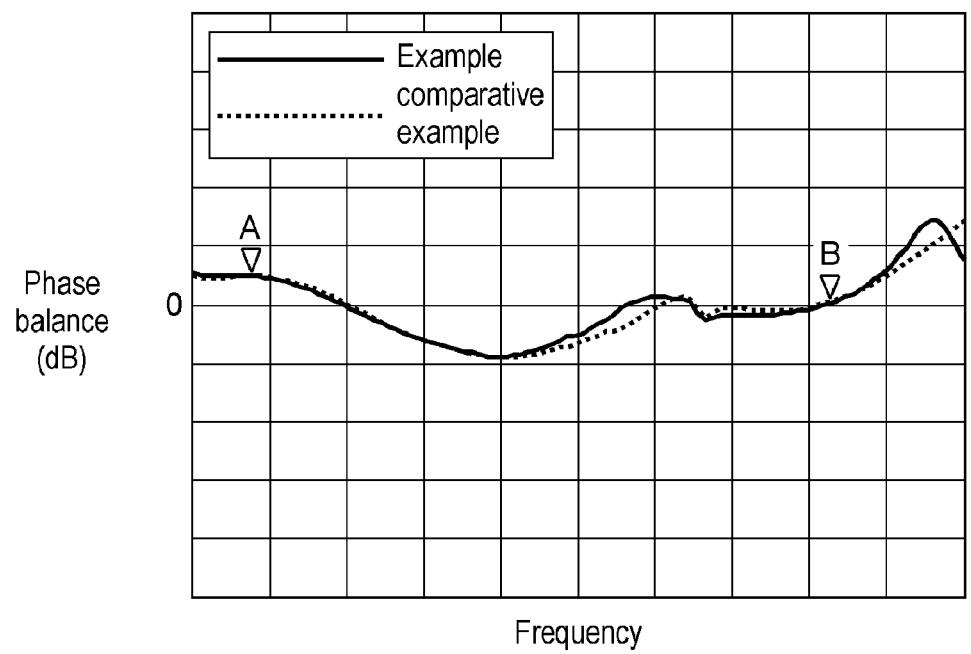
FIG. 7A is a characteristic diagram of phase balances of the acoustic wave devices according to Embodiment 1 and the comparative example.

FIG. 7A is a characteristic diagram of phase balances of low-frequency side filter 12 of the example and low-frequency side filter 112 of the comparative example in low-frequency side passband PB1. As shown in FIG. 7A, in the example, as compared to the comparative example, the phase balance is improved to a large extent in the half of the high-frequency side in low-frequency side passband PB1. This is because impedance matching in this region is improved.

Figure 7B:
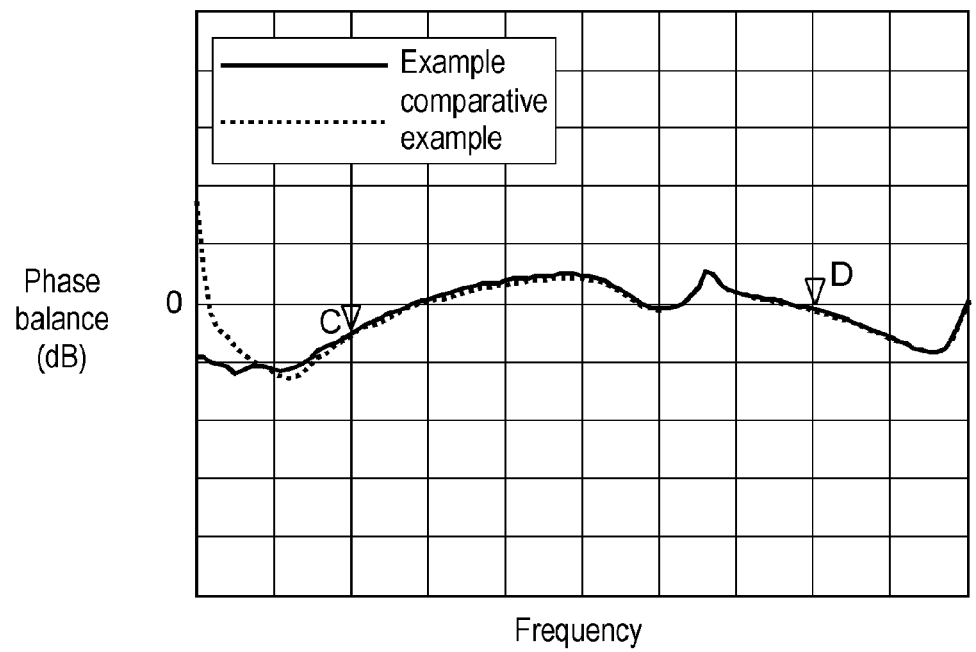
FIG. 7B is a characteristic diagram of phase balances of the acoustic wave devices according to Embodiment 1 and the comparative example.

FIG. 7B is a characteristic diagram of phase balances of high-frequency side filter 13 of the example and high-frequency side filter 113 of the comparative example in high-frequency side passband PB2. In high-frequency side passband PB2 of FIG. 7B, the phase balance between balanced terminals 16 and 17 of high-frequency side filter 13 is hardly different from that of high-frequency side filter 113.

As described above, in acoustic wave device 101 as the example, antiresonant frequencies fAR19-fAR22 of one-terminal pair acoustic wave resonators 19-22 are set to be out of low-frequency side passband PB1 on the high-frequency side and out of high-frequency side passband PB2 on the low-frequency side. With this, impedance matching of low-frequency side filter 12 in low-frequency side passband PB1 is improved, and the insertion loss in particular in low-frequency side passband PB1 is reduced to a large extent. In addition, it is possible to improve magnitudes of balances of the phase and the amplitude in low-frequency side passband PB1 to a large extent.

Here, according to Embodiment 1, all of antiresonant frequencies fAR19-fAR22 of one-terminal pair acoustic wave resonators 19-22 are set to be out of low-frequency side passband PB1 on the high-frequency side and out of high-frequency side passband PB2 on the low-frequency side, but not limited to such an example. For example, the same effect as described above can be achieved even in a case in which at least one of antiresonant frequencies fAR19-fAR22 of one-terminal pair acoustic wave resonators 19-22 is set to be out of low-frequency side passband PB1 on the high-frequency side and out of high-frequency side passband PB2 on the low-frequency side band.

In Embodiment 1, resonant frequencies fR24-fR27 of one-terminal pair acoustic wave resonators 24-27 are provided within high-frequency side passband PB2, and antiresonant frequencies fAR24-fAR27 of one-terminal pair acoustic wave resonators 24-27 are provided out of high-frequency side passband PB2 on the high-frequency side. With this, an inputted signal to high-frequency side filter 13 can be well attenuated out of high-frequency side passband PB2 on the high-frequency side. Alternatively, at least one of resonant frequencies fR24-fR27 of one-terminal pair acoustic wave resonators 24-27 can be provided within high-frequency side passband PB2, and at least one of antiresonant frequencies fAR24-fAR27 of one-terminal pair acoustic wave resonators 24-27 can be provided out of high-frequency side passband PB2 on the high-frequency side. Also with this, an inputted signal to high-frequency side filter 13 can be well attenuated.

In Embodiment 1, it is possible to reduce an insertion loss in a high-pass region in low-frequency side passband PB1 by making antiresonant frequency fAR20 of one-terminal pair acoustic wave resonator 20 and antiresonant frequency fAR19 of one-terminal pair acoustic wave resonator 19 different. Antiresonant frequency fAR19 is made higher than the maximum frequency of low-frequency side passband PB1, and lower than antiresonant frequency fAR20. With this, it is possible to improve steepness of attenuation of the inputted signal in a high-pass region of low-frequency side filter 12. This is because of the following reasons. While one-terminal pair acoustic wave resonator 19 becomes inductive between resonant frequency fR19 and antiresonant frequency fAR19, longitudinally-coupled acoustic wave resonator 18 becomes capacitive in the high-pass region of low-frequency side passband PB1. As one-terminal pair acoustic wave resonator 19 is directly connected with longitudinally-coupled acoustic wave resonator 18, these resonators have conjugate impedance. With this, it is possible to match the impedance, and to reduce the insertion loss in the high-pass region in low-frequency side passband PB1. In addition, it is possible to ensure attenuation at a position of antiresonant frequency fAR19 of one-terminal pair acoustic wave resonator 19. Further, by making antiresonant frequency fAR20 higher than antiresonant frequency fAR19, an amount of attenuation is ensured in a higher-pass region than antiresonant frequency fAR19 of one-terminal pair acoustic wave resonator 19. Antiresonant frequency fAR20 of one-terminal pair acoustic wave resonator 20 is made lower than the minimum frequency of high-frequency side passband PB2. With this, the difference between the impedance in low-frequency side passband PB1 and the impedance in high-frequency side passband PB2 on a side of balanced terminal 16 as the common connection terminal can be made small. Accordingly, it is possible to match the impedance, and to reduce insertion losses in low-frequency side passband PB1 and in high-frequency side passband PB2.

Similarly, it is possible to reduce the insertion loss in the high-pass region in low-frequency side passband PB1 by setting antiresonant frequency fAR22 of one-terminal pair acoustic wave resonator 22 and antiresonant frequency fAR21 of one-terminal pair acoustic wave resonator 21 to different values. Antiresonant frequency fAR21 is set higher than the maximum frequency of low-frequency side passband PB1, and lower than antiresonant frequency fAR22. With this, it is possible to improve steepness of attenuation of the inputted signal in the high-pass region of low-frequency side filter 12. Further, antiresonant frequency fAR22 is made higher than antiresonant frequency fAR21. With this, it is possible to ensure an amount of attenuation in a higher-pass region than antiresonant frequency fAR21 of one-terminal pair acoustic wave resonator 21. Antiresonant frequency fAR22 of one-terminal pair acoustic wave resonator 22 is made lower than the minimum frequency of high-frequency side passband PB2. With this, the difference between the impedance in low-frequency side passband PB1 and the impedance in high-frequency side passband PB2 on a side of balanced terminal 17 as the common connection terminal can be made small. Accordingly, it is possible to match the impedance, and to reduce insertion losses in low-frequency side passband PB1 and in high-frequency side passband PB2.

In Embodiment 1, antiresonant frequency fAR25 of one-terminal pair acoustic wave resonator 25 and antiresonant frequency fAR24 of one-terminal pair acoustic wave resonator 24 of high-frequency side filter 13 are set to different values. With this, it is possible to suppress deterioration in the magnitude of balance. In addition, by making antiresonant frequency fAR25 higher than antiresonant frequency fAR24, it is possible to improve steepness of attenuation of the inputted signal in bandpass characteristics.

Similarly, it is possible to improve filter characteristics in a high-pass region of high-frequency side filter 13 by making antiresonant frequency fAR27 of one-terminal pair acoustic wave resonator 27 and antiresonant frequency fAR26 of one-terminal pair acoustic wave resonator 26 different. Antiresonant frequency fAR26 is made higher than the maximum frequency of high-frequency side passband PB2, and lower than antiresonant frequency fAR27. With this, it is possible to improve steepness of attenuation of the inputted signal in the high-pass region of high-frequency side filter 13. Antiresonant frequency fAR27 is made higher than antiresonant frequency fAR26. With this, it is possible to ensure an amount of attenuation in a higher-pass region than antiresonant frequency fAR26 of one-terminal pair acoustic wave resonator 26.

As described above, acoustic wave device 101 according to Embodiment 1 is provided with low-frequency side filter 12 having low-frequency side passband PB1, high-frequency side filter 13 having high-frequency side passband PB2, balanced terminal 16, and balanced terminal 17. Low-frequency side filter 12 is connected to unbalanced terminal 15. Low-frequency side passband PB1 is the frequency band from a first minimum frequency to a first maximum frequency. High-frequency side filter 13 is connected to unbalanced terminal 15. High-frequency side passband PB2 is the frequency band from a second minimum frequency higher than the first maximum frequency to a second maximum frequency. Balanced terminals 16 and 17 are connected in common to low-frequency side filter 12 and high-frequency side filter 13. Low-frequency side filter 12 includes longitudinally-coupled acoustic wave resonator 18 and one-terminal pair acoustic wave resonator 19 connected in series to longitudinally-coupled acoustic wave resonator 18. The antiresonant frequency of one-terminal pair acoustic wave resonator 19 is set to be higher than the first maximum frequency and lower than the second minimum frequency.

Further, longitudinally-coupled acoustic wave resonator 18 is connected to unbalanced terminal 14. One-terminal pair acoustic wave resonator 19 is connected in series between longitudinally-coupled acoustic wave resonator 18 and balanced terminal 16. Low-frequency side filter 12 further includes one-terminal pair acoustic wave resonator 21 connected in series between longitudinally-coupled acoustic wave resonator 18 and balanced terminal 16. High-frequency side filter 13 includes longitudinally-coupled acoustic wave resonator 23, one-terminal pair acoustic wave resonator 24, and one-terminal pair acoustic wave resonator 26. Longitudinally-coupled acoustic wave resonator 23 is connected to unbalanced terminal 15. One-terminal pair acoustic wave resonator 24 is connected in series between longitudinally-coupled acoustic wave resonator 23 and balanced terminal 16. One-terminal pair acoustic wave resonator 26 is connected in series between longitudinally-coupled acoustic wave resonator 23 and balanced terminal 17.

Further, by providing capacitive element 28 for the high-frequency side filter or the low-frequency side filter, it is possible to adjust the fractional bandwidth of the high-frequency side filter or the low-frequency side filter. According to acoustic wave device 101 of Embodiment 1, in high-frequency side filter 13, capacitive element 28 is connected between a line connecting one-terminal pair acoustic wave resonator 24 with one-terminal pair acoustic wave resonator 25, and a line connecting one-terminal pair acoustic wave resonator 26 with one-terminal pair acoustic wave resonator 27. Specifically, capacitive element 28 is connected between connection point 40 and connection point 41 illustrated in FIG. 1A in series with connection points 40 and 41. By providing capacitive element 28 for high-frequency side filter 13, the fractional bandwidths of low-frequency side filter 12 and high-frequency side filter 13 formed on the same piezoelectric substrate 11 can be made different. Thus, it is possible to adjust the bandwidth of high-frequency side filter 13 so as to become narrower.

Figure 8:
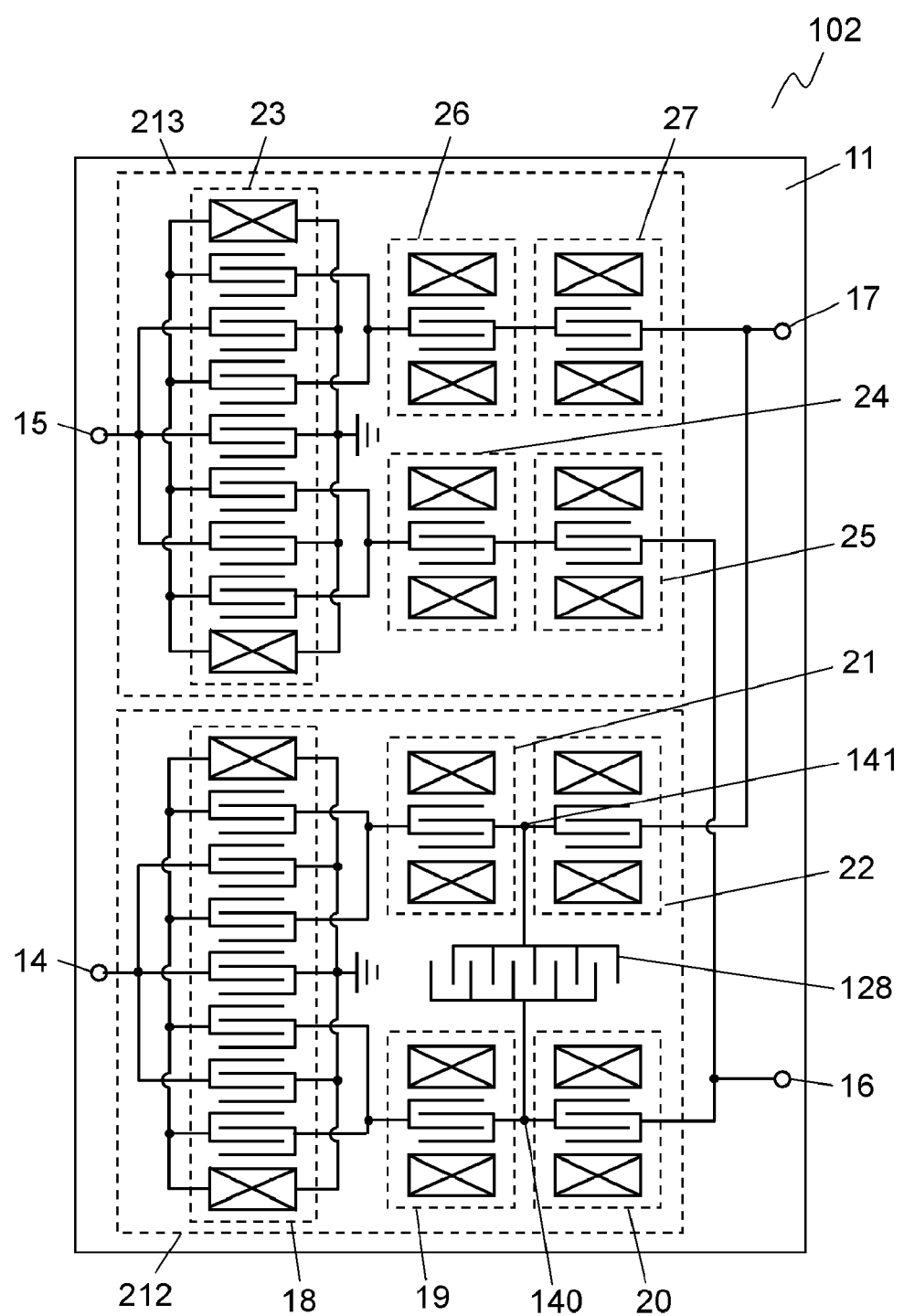
FIG. 8 is a circuit diagram of another acoustic wave device according to Embodiment 1.

Here, when making the fractional bandwidth in low-frequency side passband PB1 to be narrower than the fractional bandwidth of high-frequency side passband PB2, a capacitive element may be provided for low-frequency side filter 12 contrary to acoustic wave device 101 illustrated in FIG. 1A. FIG. 8 is a circuit diagram of another acoustic wave device 102 according to Embodiment 1. Referring to FIG. 8, components of acoustic wave device 102 that are the same as the components of acoustic wave device 101 illustrated in FIG. 1A are denoted by the same reference numerals. Acoustic wave device 102 is provided with low-frequency side filter 212 and high-frequency side filter 213, in place of low-frequency side filter 12 and high-frequency side filter 13 of acoustic wave device 101. Acoustic wave device 102 includes capacitive element 128, in place of capacitive element 28 of acoustic wave device 101. Capacitive element 128 is formed by a conductive pattern provided on piezoelectric substrate 11. Referring to FIG. 8, one-terminal pair acoustic wave resonator 19 and one-terminal pair acoustic wave resonator 20 are connected at connection point 140. One-terminal pair acoustic wave resonator 21 and one-terminal pair acoustic wave resonator 22 are connected at connection point 141. Capacitive element 128 is connected in series between connection point 140 and connection point 141 in series with connection points 140 and 141.

With such a configuration, it is possible to make the fractional bandwidth in low-frequency side passband PB1 narrower than the fractional bandwidth in high-frequency side passband PB2.

Second Exemplary Embodiment

Acoustic wave device 103 according to Embodiment 2 will be described with reference to the drawings.

Figure 9:
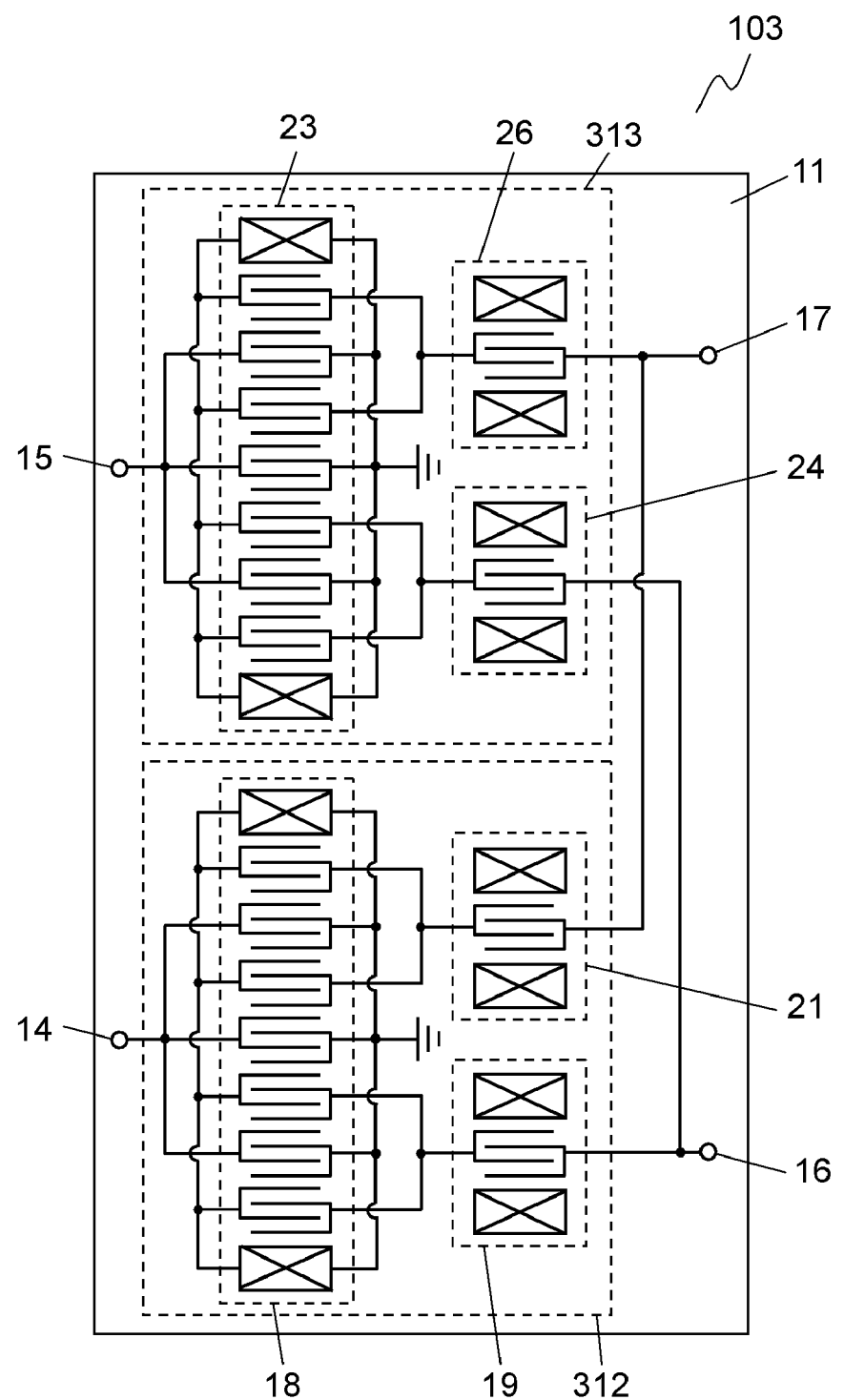
FIG. 9 is a circuit diagram of an acoustic wave device according to Embodiment 2.

FIG. 9 is a circuit diagram of acoustic wave device 103 according to Embodiment 2. Referring to FIG. 9, components of acoustic wave device 103 according to Embodiment 2 that are the same as the components of acoustic wave device 101 according to Embodiment 1 illustrated in FIG. 1A are denoted by the same reference numerals.

Acoustic wave device 103 according to Embodiment 2 is provided with low-frequency side filter 312 and high-frequency side filter 313, in place of low-frequency side filter 12 and high-frequency side filter 13 of acoustic wave device 101 according to Embodiment 1. Acoustic wave device 103 according to Embodiment 2 is different from acoustic wave device 101 according to Embodiment 1 in that a single one-terminal pair acoustic wave resonator is provided for each of low-frequency side filter 312 and high-frequency side filter 313, while two one-terminal pair acoustic wave resonators are provided in series between each of longitudinally-coupled acoustic wave resonator 18 and balanced terminal 16, and longitudinally-coupled acoustic wave resonator 23 and balanced terminal 17 in low-frequency side filter 12 and high-frequency side filter 13 of acoustic wave device 101 according to Embodiment 1.

Specifically, first one-terminal pair acoustic wave resonator 19 is provided between longitudinally-coupled acoustic wave resonator 18 and balanced terminal 16, and second one-terminal pair acoustic wave resonator 21 is provided between longitudinally-coupled acoustic wave resonator 18 and balanced terminal 17. Further, third one-terminal pair acoustic wave resonator 24 is provided between longitudinally-coupled acoustic wave resonator 23 and balanced terminal 16, fourth one-terminal pair acoustic wave resonator 26 is provided between longitudinally-coupled acoustic wave resonator 23 and balanced terminal 17.

An antiresonant frequency of at least one of one-terminal pair acoustic wave resonators 19 and 21 is set to be out of low-frequency side passband PB1 on the high-frequency side, and out of high-frequency side passband PB2 on the low-frequency side. Specifically, the antiresonant frequency of at least one of one-terminal pair acoustic wave resonators 19 and 21 is set to be a value higher than the maximum frequency of low-frequency side passband PB1 and lower than the minimum frequency of high-frequency side passband PB2. With this, mixing of a signal from one filter to the other filter is suppressed, and impedance matching in the passband is improved. As a result, it is possible to reduce the insertion loss and to improve the magnitude of balance.

INDUSTRIAL APPLICABILITY

The acoustic wave device according to the present invention is capable of suppressing mixing of a signal to the other filter, improving impedance matching in the passband, and obtaining superior electrical characteristics, and is useful as an acoustic wave device mainly used for mobile communication devices, provided with a plurality of acoustic wave filters and having common balanced terminals.

What is claimed is:

1. An acoustic wave device comprising:
   first and second unbalanced terminals;
   first and second balanced terminals;
   a high-frequency filter including a first longitudinally-coupled acoustic wave resonator connected to the first unbalanced terminal, a first one-terminal pair acoustic wave resonator connected in series between the first longitudinally-coupled acoustic wave resonator and the first balanced terminal, and a second one-terminal pair acoustic wave resonator connected in series between the first longitudinally-coupled acoustic wave resonator and the second balanced terminal, the high-frequency filter having a high-frequency passband from a first minimum frequency to a first maximum frequency; and
   a low-frequency filter including a second longitudinally-coupled acoustic wave resonator connected to the second unbalanced terminal, a third one-terminal pair acoustic wave resonator connected in series between the second longitudinally-coupled acoustic wave resonator and the first balanced terminal, a fourth one-terminal pair acoustic wave resonator connected in series between the second longitudinally-coupled acoustic wave resonator and the second balanced terminal, a fifth one-terminal pair acoustic wave resonator connected in series between the third one-terminal pair acoustic wave resonator and the first balanced terminal, and a sixth one-terminal pair acoustic wave resonator connected in series between the fourth one-terminal pair acoustic wave resonator and the second balanced terminal, the low-frequency filter having a low-frequency passband from a second minimum frequency to a second maximum frequency lower than the first minimum frequency, and at least one of an antiresonant frequency of the third one-terminal pair acoustic wave resonator and an antiresonant frequency of the fourth one-terminal pair acoustic wave resonator being between the second maximum frequency and the first minimum frequency.

2. The acoustic wave device of claim 1 wherein the antiresonant resonant frequencies of both the third and fourth one-terminal pair acoustic wave resonators are between the second maximum frequency and the first minimum frequency.

3. The acoustic wave device of claim 1 wherein the antiresonant frequencies of the third and fourth one-terminal pair acoustic wave resonators and an antiresonant frequency of each of the fifth and sixth one-terminal pair acoustic wave resonators are higher than the second maximum frequency and lower than the first minimum frequency.

4. The acoustic wave device of claim 1 wherein the high-frequency filter further includes a seventh one-terminal pair acoustic wave resonator connected in series between the first one-terminal pair acoustic wave resonator and the first balanced terminal, and an eighth one-terminal pair acoustic wave resonator connected in series between the second one-terminal pair acoustic wave resonator and the second balanced terminal.

5. The acoustic wave device of claim 4 wherein a resonant frequency of at least one of the first, second, seventh, and eighth one-terminal pair acoustic wave resonators is within the high-frequency passband.

6. The acoustic wave device of claim 5 wherein an antiresonant frequency of at least one of the first, second, seventh, and eighth one-terminal pair acoustic wave resonators is higher than the first maximum frequency.

7. The acoustic wave device of claim 5 wherein the resonant frequencies of the first, second, seventh, and eighth one-terminal pair acoustic wave resonators are within the high-frequency passband.

8. The acoustic wave device of claim 7 wherein the antiresonant frequencies of the first, second, seventh, and eighth one-terminal pair acoustic wave resonators are higher than the first maximum frequency.

9. The acoustic wave device of claim 4 wherein an antiresonant frequency of the fifth one-terminal pair acoustic wave resonator is different than the antiresonant frequency of the third one-terminal pair acoustic wave resonator.

10. The acoustic wave device of claim 9 wherein the antiresonant frequency of the fifth one-terminal pair acoustic wave resonator is higher than the antiresonant frequency of the third one-terminal pair acoustic wave resonator.

11. The acoustic wave device of claim 10 wherein an antiresonant frequency of the sixth one-terminal pair acoustic wave resonator is different than the antiresonant frequency of the fourth one-terminal pair acoustic wave resonator.

12. The acoustic wave device of claim 11 wherein the antiresonant frequency of the sixth one-terminal pair acoustic wave resonator is higher than the antiresonant frequency of the fourth one-terminal pair acoustic wave resonator.

13. The acoustic wave device of claim 4 wherein the high-frequency filter further includes a capacitive element connected between a first connection point and a second connection point, the first connection point being between the first and seventh one-terminal pair acoustic wave resonators, and the second connection point being between the second and eighth one-terminal pair acoustic wave resonators.

14. The acoustic wave device of claim 13 further comprising a piezoelectric substrate, the high-frequency filter and the low-frequency filter being formed on the piezoelectric substrate, the capacitive element including a conductive pattern formed on the piezoelectric substrate.

15. The acoustic wave device of claim 4 wherein an antiresonant frequency of the seventh one-terminal pair acoustic wave resonator is different than the antiresonant frequency of the first one-terminal pair acoustic wave resonator.

16. The acoustic wave device of claim 15 wherein the antiresonant frequency of the seventh one-terminal pair acoustic wave resonator is higher than the antiresonant frequency of the first one-terminal pair acoustic wave resonator.

17. The acoustic wave device of claim 16 wherein an antiresonant frequency of the eighth one-terminal pair acoustic wave resonator is different than the antiresonant frequency of the second one-terminal pair acoustic wave resonator.

18. The acoustic wave device of claim 17 wherein the antiresonant frequency of the eighth one-terminal pair acoustic wave resonator is higher than the antiresonant frequency of the second one-terminal pair acoustic wave resonator.

19. An acoustic wave device comprising:
   first and second unbalanced terminals;
   first and second balanced terminals;
   a high-frequency filter including a first longitudinally-coupled acoustic wave resonator connected to the first unbalanced terminal, first and second one-terminal pair acoustic wave resonators connected in series between the first longitudinally-coupled acoustic wave resonator and the first balanced terminal, third and fourth one-terminal pair acoustic wave resonators connected in series between the first longitudinally-coupled acoustic wave resonator and the second balanced terminal, the high-frequency filter having a high-frequency passband from a first minimum frequency to a first maximum frequency, and a capacitive element connected between a first connection point and a second connection point, the first connection point being between the first and second one-terminal pair acoustic wave resonators, and the second connection point being between the third and fourth one-terminal pair acoustic wave resonators; and a low-frequency filter including a second longitudinally-coupled acoustic wave resonator connected to the second unbalanced terminal, fifth and sixth one-terminal pair acoustic wave resonators connected in series between the second longitudinally-coupled acoustic wave resonator and the first balanced terminal, and seventh and eighth one-terminal pair acoustic wave resonators connected in series between the second longitudinally-coupled acoustic wave resonator and the second balanced terminal, the low-frequency filter having a low-frequency passband from a second minimum frequency to a second maximum frequency lower than the first minimum frequency, an antiresonant frequency of at least one of the fifth, sixth, seventh, and eighth one-terminal pair acoustic wave resonators being between the second maximum frequency and the first minimum frequency, and a fractional bandwidth of the high-frequency filter being narrower than a fractional bandwidth of the low-frequency filter.

* * * * *